(12) United States Patent
Kim et al.

(10) Patent No.: US 11,190,220 B2
(45) Date of Patent: Nov. 30, 2021

(54) APPARATUS AND METHOD FOR MANAGING PARITY CHECK MATRIX

(71) Applicant: SK hynix Inc., Gyeonggi-do (KR)

(72) Inventors: Dae Sung Kim, Gyeonggi-do (KR); Chol Su Chae, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 105 days.

(21) Appl. No.: 16/667,314

(22) Filed: Oct. 29, 2019

(65) Prior Publication Data
US 2020/0304156 A1  Sep. 24, 2020

(30) Foreign Application Priority Data

Mar. 20, 2019 (KR) ........................ 10-2019-0031637

(51) Int. Cl.
*H03M 13/00* (2006.01)
*H03M 13/11* (2006.01)

(52) U.S. Cl.
CPC ....... *H03M 13/616* (2013.01); *H03M 13/116* (2013.01)

(58) Field of Classification Search
CPC .......................... H03M 13/616; H03M 13/116
See application file for complete search history.

(56) References Cited

U.S. PATENT DOCUMENTS

| 2005/0154958 A1* | 7/2005 | Xia ........................ H04L 1/0051 714/752 |
| 2017/0250712 A1* | 8/2017 | Chiu ..................... H04L 1/1819 |
| 2020/0099394 A1* | 3/2020 | Chang ................. H03M 13/155 |

FOREIGN PATENT DOCUMENTS

KR            100949519           3/2010

* cited by examiner

*Primary Examiner* — Thien Nguyen
(74) *Attorney, Agent, or Firm* — IP & T Group LLP

(57) ABSTRACT

A parity check matrix managing technology generating and modifying parity check matrix for encoding and decoding data to be processed in a communication system, memory system, and the like is disclosed. A parity check matrix managing apparatus may include an input device configured to receive a parity check matrix as a modification target; a matrix modifier configured to modify the parity check matrix by performing at least one of a cyclic shift on unit components of at least one row or column in the parity check matrix and a location change between at least two rows or columns in the parity check matrix to generate a modified parity check matrix; and a controller configured to control the matrix modifier to compare a matrix size of the modified parity check matrix with a set matrix size, so that the matrix size is less than or equal to the set matrix size.

18 Claims, 14 Drawing Sheets

APPARATUS AND METHOD FOR MANAGING PARITY CHECK MATRIX

CROSS-REFERENCE TO RELATED APPLICATION

The present application claims priority under 35 U.S.C. § 119(a) to Korean application number 10-2019-0031637, filed on Mar. 20, 2019, in the Korean Intellectual Property Office, which is incorporated herein by reference in its entirety.

BACKGROUND

1. Technical Field

Various embodiments generally relate to a parity check matrix managing apparatus and method, and more particularly, to technology for modifying a parity check matrix used to code and decode data to be processed in a communication system, a memory system, and the like, i.e., a data processing apparatus.

2. Related Art

In general, a parity check matrix may be used to detect and correct errors of data in a communication system configured to transmit and receive data, a memory system configured to store and read data, and the like. For example, a data processing apparatus may transmit or store data by encoding the data based on the parity check matrix and receive and read data by decoding the data based on the parity check matrix. However, as a size of data to be processed increases, the size of the parity check matrix also increases. Therefore, while the size of the parity check matrix is maintained for efficiency operation of a data processing apparatus, the matrix size that the parity check matrix is required to have to be stored in the data processing apparatus needs to be reduced.

SUMMARY

In an embodiment of the present disclosure, a parity check matrix managing apparatus may include an input device configured to receive a parity check matrix as a modification target; a matrix modifier configured to modify the parity check matrix by performing at least one of a cyclic shift on unit components of at least one row or column in the parity check matrix and a location change between at least two or more rows or columns in the parity check matrix to generate a modified parity check matrix; and a controller configured to control the matrix modifier to compare a matrix size of the modified parity check matrix with a set matrix size, so that the matrix size is less than equal to the set matrix size.

In an embodiment of the present disclosure, a parity check matrix managing apparatus may include an input configured to receive matrix generation information for a parity check matrix and parity characteristic information, the matrix generation information including an index and a value of a set unit component group in the parity check matrix; a first component determiner configured to determine values of first unit components, which are unit components corresponding to the set unit component group among unit components of the parity check matrix, based on the index and value of the set unit component group; a second component determiner configured to determine values of second unit components, which are unit components not included in the set unit component group, based on the parity characteristic information; and a controller configured to control the first component determiner and the second component determiner based on the matrix generation information.

In an embodiment of the present disclosure, a parity check matrix modifying method may include: receiving a parity check matrix as a modification target; modifying the parity check matrix by performing at least one of cyclic shift on unit components of at least one row or column in the parity check matrix and location change between at least two or more rows or columns in the parity check matrix; and controlling the cyclic shift by comparing a matrix size of the modified parity check matrix with a set matrix size, so that the matrix size is less than or equal to the set matrix size.

In an embodiment of the present disclosure, a parity check matrix generating method may include: receiving matrix generation information for a parity check matrix and parity characteristic information, the matrix generation information including an index and a value of a set unit component group in the parity check matrix; determining values of first unit components, which are unit components corresponding to the set unit component group among unit components of the parity check matrix, based on the index and value of the set unit component group; and determining values of second unit components, which are unit components not included in the set unit component group among unit components of the parity check matrix, based on the parity characteristic information.

In an embodiment of the present disclosure, a system may include a first device configured to modify a parity check matrix; and a second device configured to encode and decode data according to a quasi-cyclic low density parity check (QC LDPC) scheme using the modified parity check matrix, wherein the parity check matrix comprises plural unit components each being a zero matrix, an identity matrix or a circulant permutation matrix each of which is square, and wherein the first device modifies the parity check matrix by cyclic-shifting or permuting select unit components until the modified parity check matrix has one or more macro components, each of which includes the cyclic-shifted or permuted unit components and is the identity matrix, and has a set matrix size or less.

According to an embodiment of the present disclosure, a parity check matrix of a small matrix size may be generated.

According to an embodiment of the present disclosure, a QC-LDPC parity check matrix may be generated.

According to an embodiment of the present disclosure, a parity check matrix may be generated based on cyclic shift.

These and other features, aspects, and embodiments are described below.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present invention are described in greater detail with reference to the accompanying drawings. The drawings are schematic illustrations of features, structures and intermediate structures. As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein in the context of various embodiments of the present invention. However, the present invention is not limited to the disclosed embodiments. Those skilled in the art will understand that changes may be made in these embodiments without departing from the principles and spirit of the present invention. Throughout the specification, reference to "an embodiment," "another embodiment" or the like is not necessarily to only one embodiment, and different references to any such phrase are not necessarily to the same embodiment(s).

Figure 1:
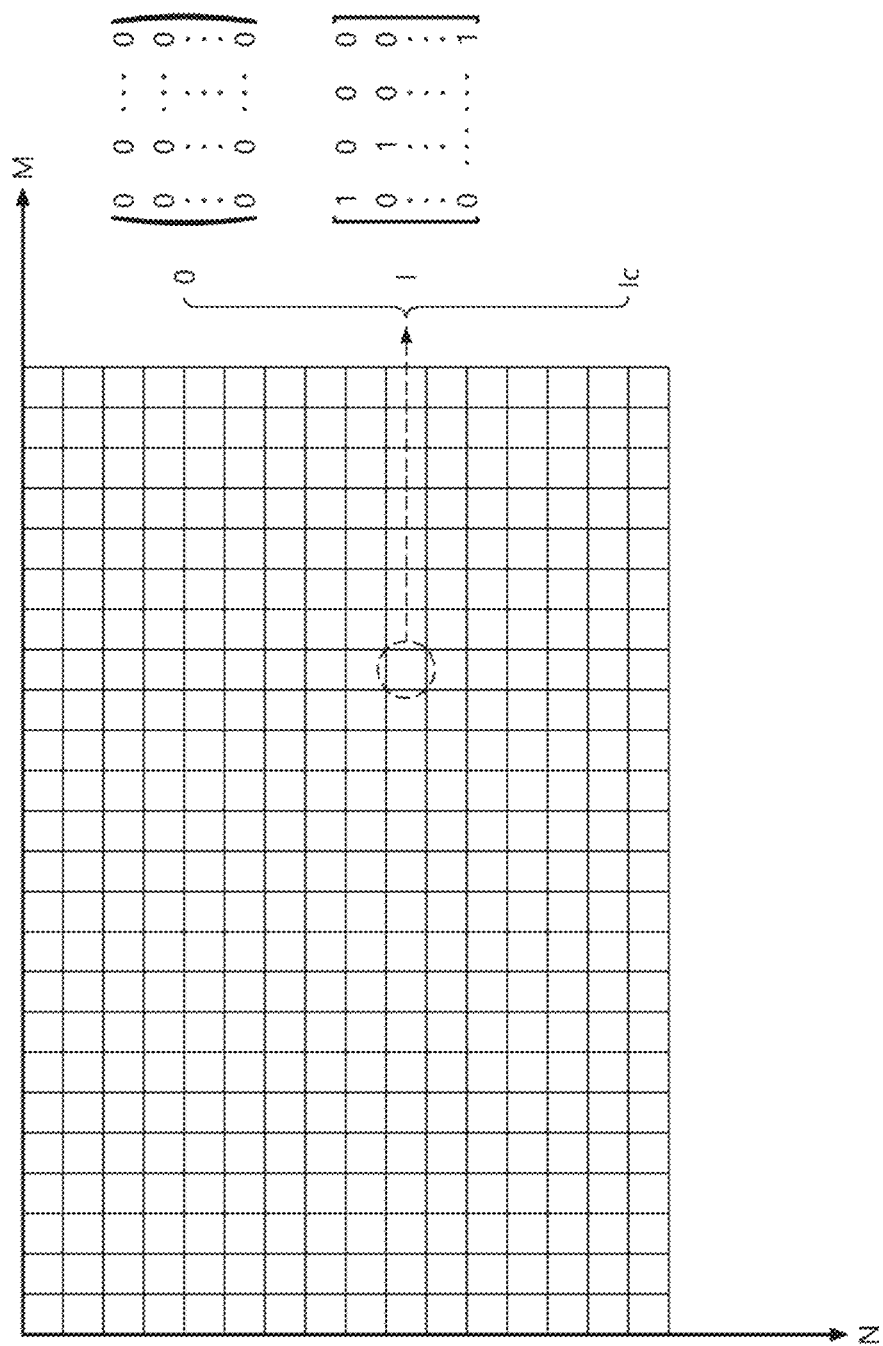
FIG. 1 is a diagram illustrating a parity check matrix according to an embodiment of the present disclosure.

FIG. 1 is a diagram illustrating an example of a parity check matrix according to an embodiment.

Referring to FIG. 1, a quasi-cyclic low-density parity check (QC LDPC) code type parity check matrix (QC LDPC parity check matrix) corresponding to the QC LDPC code is illustrated. The QC LDPC parity check matrix may have an N×M size in unit components and each unit component in the parity check matrix may be a block matrix having an a×b size. In an embodiment, and as shown in FIG. 1, the unit component may be a square matrix. For example, each unit component may be any one of a zero matrix 0, an identity matrix I, and a circulant permutation matrix (CPM) Ic for the identity matrix. The character c in the circulant permutation matrix Ic may refer to a permutation value indicating a circulant-permutated degree of the identity matrix I and the permutation value may indicate a value that components in a row and/or a column are shifted within the identity matrix I. Such a QC LDPC parity check matrix may have unit components of the zero matrix, the identity matrix, and the circulant permutation matrix for the identity matrix and thus the coding characteristic (or parity characteristic) of the QC LDPC parity check matrix may be maintained even when the cyclic shift on the unit components in the row and/or column is performed within the QC LDPC parity check matrix. For example, various types of QC LDPC parity check matrixes having the same coding characteristic as each other may be generated through cyclic shift and/or permutation of the row and/or column in the QC LDPC parity check matrix.

Figure 2:
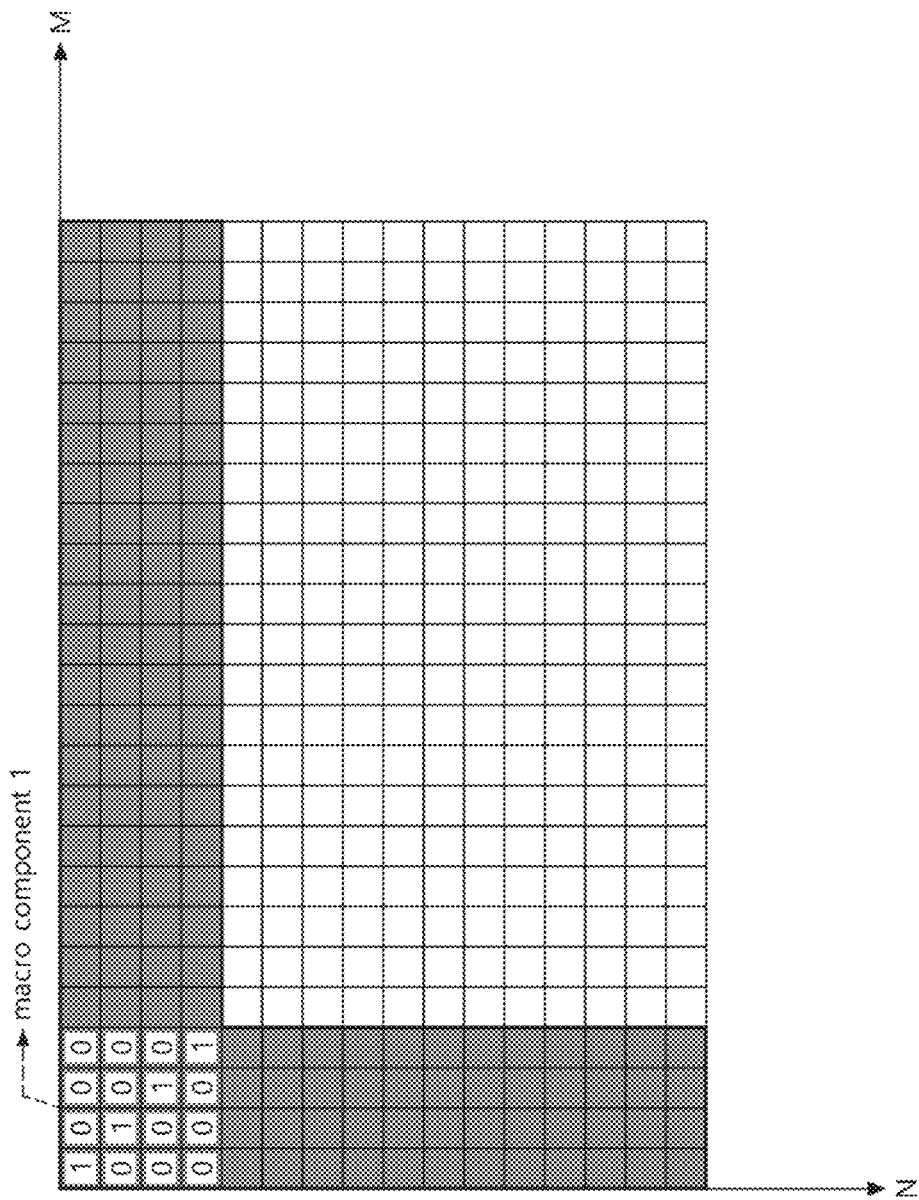
FIGS. 2 to 4 are diagrams explaining a matrix size of a parity check matrix according to an embodiment of the present disclosure.
Figure 3:
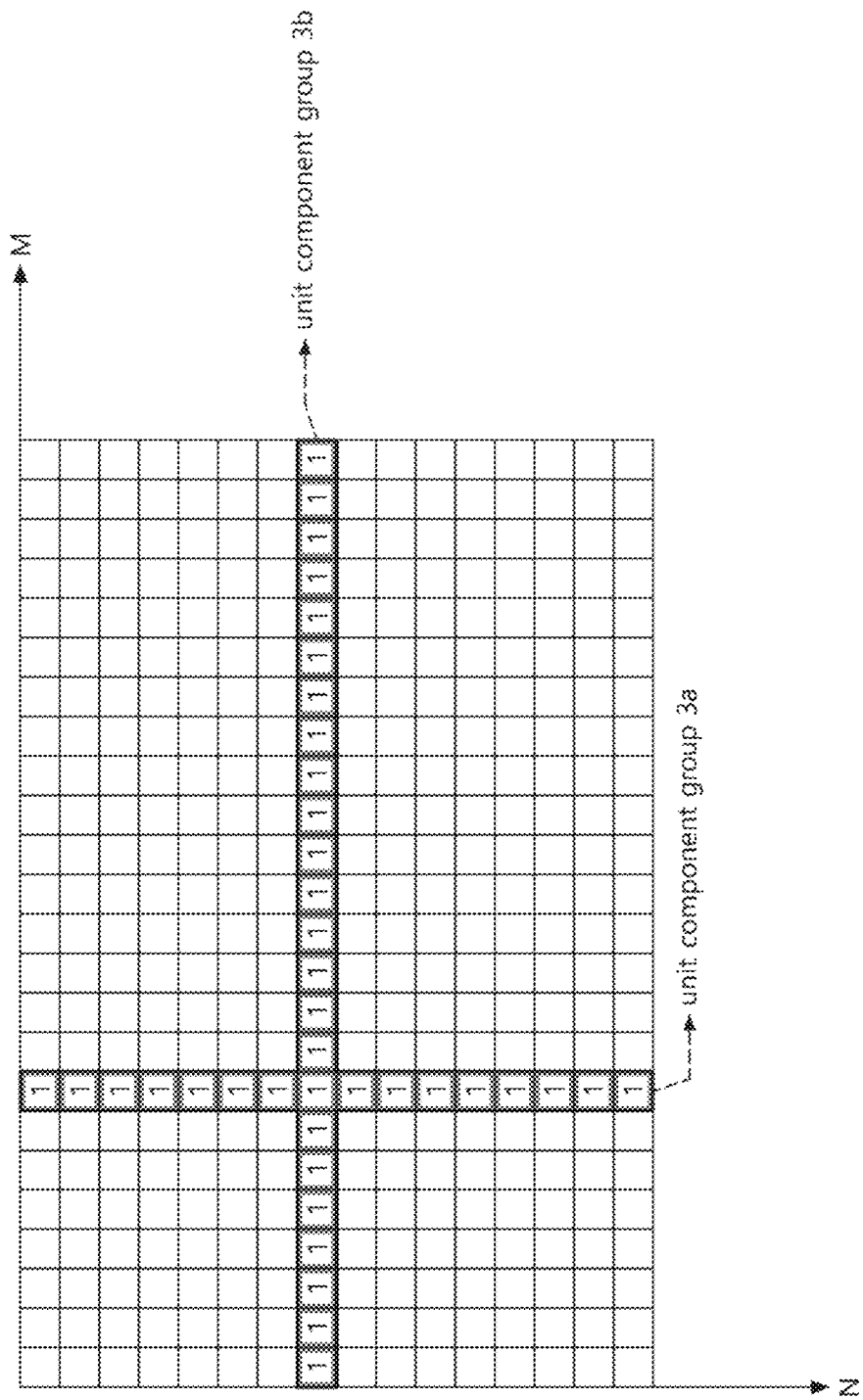
Figure 4:
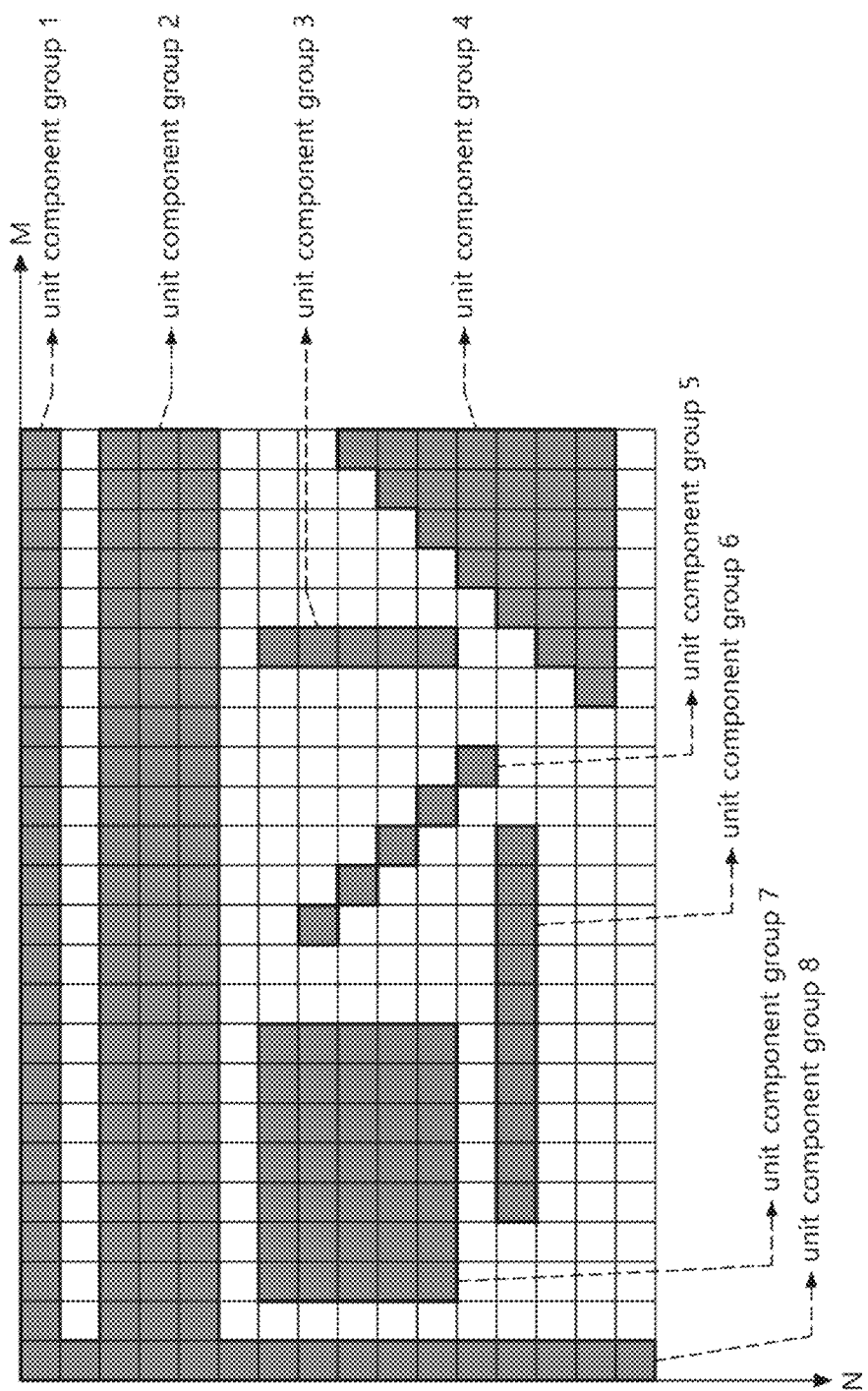

FIGS. 2 to 4 are diagrams explaining a matrix size of a parity check matrix according to an embodiment. A matrix size, or simply size, of a parity check matrix is defined in this disclosure as a size of information indicating indexes and values of unit components and macro components configuring the parity check matrix. The information represents the parity check matrix and is stored in the data processing apparatus. The macro component is described below.

A data processing apparatus employing the parity check matrix may load the parity check matrix stored in a storage device such as a memory to encode or decode data to be processed. For example, the data processing apparatus may generate the parity check matrix based on the information stored therein and thus may store information which may specify values of all unit components configuring the parity check matrix.

The data processing apparatus basically has to store indexes indicating row and column numbers and values indicating zero matrix, identity matrix, and circulant permutation matrix of all the unit components included in the parity check matrix. For example, when the number of the unit components of the zero matrix is X, the number of the unit components of the identity matrix is Y, and the number of the unit components of the circulant permutation matrix is Z, the data processing apparatus basically has to store the indexes and values of (X+Y+Z) unit components. When storing the values of the unit components of the circulant permutation matrix, information on the circulant permutation degree c. for the identity matrix has to be further stored. Therefore, as the number of unit components of the circulant permutation matrix is increased, the matrix size may be increased.

Since various circulant permutation matrixes exist according to the circulant permutation degree c. the unit components of the circulant permutation matrix need to be individually stored. When the unit components of the circulant permutation matrix are individually stored, the remaining unit components may be one between the zero matrix or the identity matrix. Therefore, only one unit component of the zero matrix and the identity matrix among the unit components may be stored and thus the matrix size may be reduced. For example, when only the unit components of the circulant permutation matrix and the zero matrix among the unit components of the parity check matrix may be stored, all other unit components of the parity check matrix may be set to the identity matrix and thus information indicating the remaining unit components of the identity matrix may not be stored. Therefore, the matrix size of the parity check matrix may be reduced.

Unit components of a specific region in the parity matrix (set unit component group) may form a macro component. In an embodiment, each macro component may be a square matrix. In an embodiment, each macro component may be the identity matrix. In accordance with an embodiment of the present invention, when the indexes and values of the unit components in the parity check matrix may be stored in units of the macro components each being the identity matrix, the matrix size may be reduced.

Referring to FIG. 2, the set unit component group of the parity check matrix forms at least one macro component. For example, the macro component 1 may have a 4×4 size in component units and may be a single identify matrix having 16 unit components each of which is one between the zero matrix and the identity matrix. Accordingly, when the data processing apparatus stores information representing the parity check matrix illustrated in FIG. 2, 16 unit components in the macro component 1 may be regarded as a single identity matrix and thus the matrix size of the parity check matrix may be reduced.

When the unit components in the set unit component group of the parity check matrix are previously set to have a specific value after the cyclic-shift and/or the permutation of the unit components in the set unit component group, i.e., when the unit components in the set unit component group of the parity check matrix are previously set to become the macro component as a single identity matrix after the cyclic-shift and/or the permutation of the unit components in the set unit component group, information of the indexes and values of the unit components in the set unit component group need not to be stored and thus the matrix size may be reduced.

Referring to FIG. 3, a unit component group 3a specified by a row of the parity check matrix and a unit component group 3b specified by a column of the parity check matrix are illustrated. The unit component group 3a may be a group configured of unit components in an eighth row of the parity check matrix and the unit components may correspond to the identity matrix. The unit component group 3b may be a group configured of unit components in an eighth column of the parity check matrix and the unit components may correspond to the identity matrix. Accordingly, when the parity check matrix illustrated in FIG. 3 is stored, the values of the unit components in the eighth row and the eighth column may be determined to the identity matrix in advance. Therefore, the indexes and values of the unit components need not to be stored and thus the matrix size may be reduced. The example that the unit components of the set unit component group illustrated in FIG. 3 are the identity matrix is merely exemplary. As those skilled in the art will understand, the principals of the example may be applied to the parity check matrix such that the unit components of the set unit component group form a specific cyclic matrix.

Referring to FIG. 4, various examples of the set unit component groups of the parity check matrix are illustrated. A unit component group 1 may refer to a unit component group specified by any one of the rows in the parity check matrix. The unit component group 2 may refer to a unit component group specified by a plurality of rows among the rows in the parity check matrix. The unit component group 3 may refer to a unit component group specified by partial unit components in any one column among the columns constituting the parity check matrix. The unit component group 4 may refer to a unit component group specified by diagonal unit components of the parity check matrix. The unit component group 5 may refer to a unit component group specified by unit components neighboring in a diagonal direction among the unit components in the parity check matrix. The unit component group 6 may refer to a unit component group specified by partial unit components in any one of the rows constituting the parity check matrix. The unit component group 7 may refer to a unit component group specified by a partial matrix in the parity check matrix. The unit component group 8 may refer to a unit component group specified by any one column in the parity check matrix. The illustrated unit components groups are merely exemplary and the present invention is not limited thereto. The unit component groups may be interpreted to include unit component groups configured of arbitrary unit components.

The present disclosure may provide the technology of setting the unit component group to have a specific value in advance as described above and performing cyclic-shift and/or permutation on the set unit component group to modify the parity check matrix to have a small matrix size by generating the macro component as a single identity matrix comprising plural unit components of the zero matrixes and the identity matrixes within the modified parity check matrix.

Figure 5:
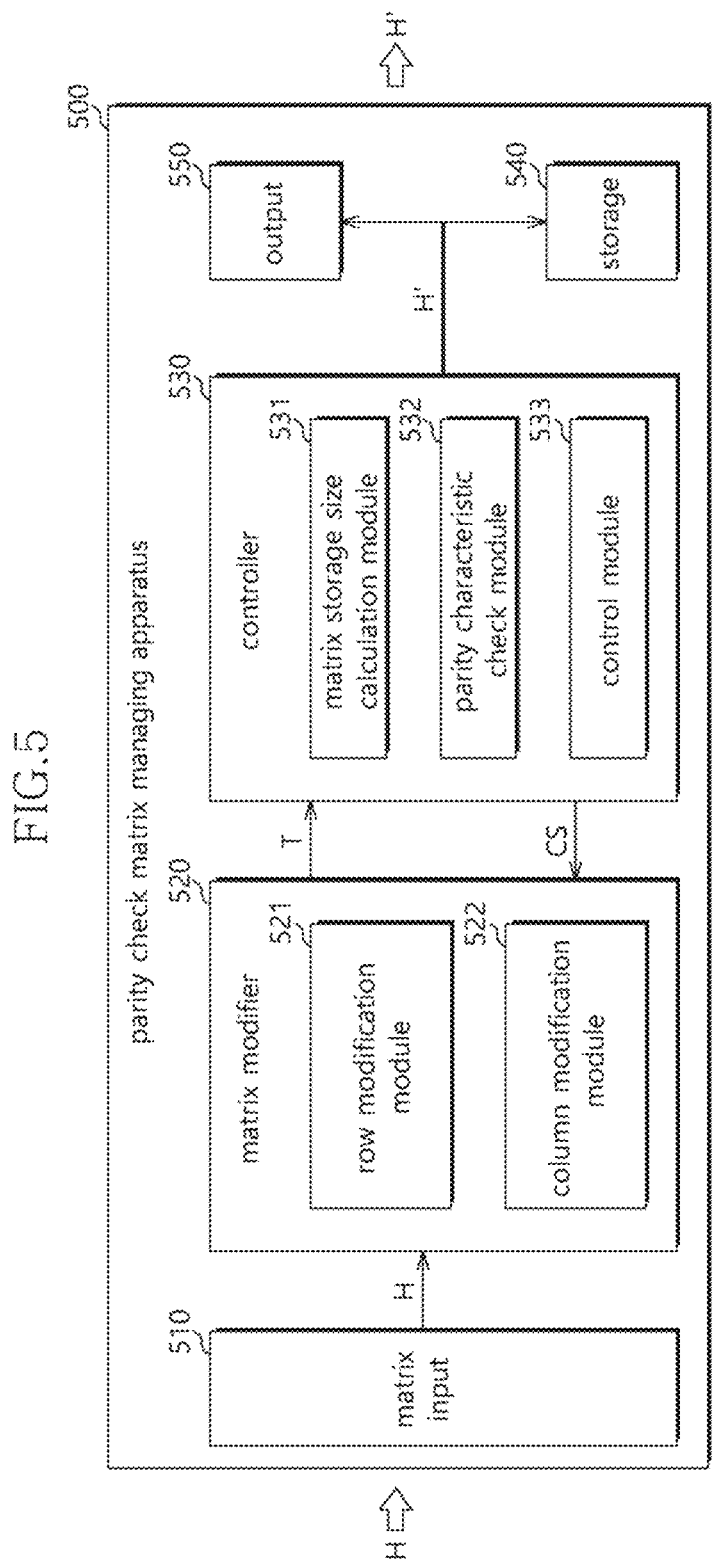
FIG. 5 is a block diagram illustrating a parity check matrix managing apparatus according to an embodiment of the present disclosure.

FIG. 5 is a block diagram illustrating a parity check matrix managing apparatus according to an embodiment.

Referring to FIG. 5, a parity check matrix managing apparatus 500 may include a matrix input 510, a matrix modifier 520, a controller 530, a storage 540, and an output 550.

The matrix input 510 may receive the parity check matrix H which is a modification target. For example, the matrix input 510 may receive the parity check matrix to be modified from other external devices or the user. The matrix input 510 may transmit the parity check matrix H to the matrix modifier 520.

In an embodiment, the matrix input 510 may receive information on a set matrix size to modify the parity check matrix H to a modified parity check matrix having the set matrix size or less. Here, the set matrix size may be differently set according to the needs of the data processing apparatus which use the parity check matrix. As described above, a matrix size of a parity check matrix is defined in this disclosure as a size of information indicating indexes and values of unit components and macro components configuring the parity check matrix. The information represents the parity check matrix and is stored in the data processing apparatus. The macro component is described below.

In an embodiment, the parity check matrix H as a modification target may correspond to the QC LDPC code. Here, the QC LDPC code may be a kind of LDPC code and each unit component constituting the parity check matrix H may be any one of the zero matrix, the identity matrix, and the circulant permutation matrix.

The matrix modifier 520 may perform the cyclic shift on the parity check matrix. For example, the matrix modifier 520 may modify the parity check matrix by performing cyclic shift on the parity check matrix. The matrix modifier 520 may include a row modification module 521 configured to cyclic-shift an N-th row of the parity check matrix by L (for example, "L" may be an amount of rows) and a column modification module 522 configured to cyclic-shift an M-th column of the parity check matrix by K (for example, "K" may be an amount of columns). Here, the values of N, L, M, and K may be determined through a controller 350 described below, so that the matrix size is equal to or smaller than the set matrix size.

In an embodiment, the row modification module 521 may cyclic-shift the unit components of at least one row in the parity check matrix.

In an embodiment, the row modification module 521 may permute, with each other, unit components located in different rows in the parity check matrix.

In an embodiment, the column modification module 522 may cyclic-shift the unit components of at least one column in the parity check matrix.

In an embodiment, the column modification module 522 may permute, with each other, unit components located in different columns in the parity check matrix.

The matrix modifier 520 may transmit the modified parity check matrix T to the controller 530.

In an embodiment, the matrix modifier 520 may perform cyclic shift on the parity check matrix so that specific unit components (for example, unit components in a set unit component group or the macro component) of the parity check matrix may have the identity matrix value according to a control signal CS of the controller 530. For example, the matrix modifier 520 may cyclic-shift the rows in the parity check matrix so that the unit components in the first column of the parity check matrix are the identity matrix.

The controller 530 may control the cyclic shift operation. For example, the controller 530 may control the cyclic shift of the matrix modifier 520 so that the parity check matrix may be modified to have the set matrix size or less. The controller 530 may include a matrix size calculation module 531 and a matrix modification control module 533.

The matrix size calculation module 531 may calculate the matrix size of the modified parity check matrix T. For example, the matrix size calculation module 531 may calculate the matrix size of the modified parity check matrix T currently modified through cyclic-shift by the matrix modifier 520 based on the indexes and values of the unit components of the modified parity check matrix T. The matrix size calculation module 531 may calculate the matrix size of the currently modified parity check matrix T whenever the cyclic shift on the parity check matrix is performed.

The matrix modification control module 533 may generate the control signal CS for controlling the matrix modifier 520 to iterate the cyclic shift until the matrix size of the modified parity check matrix becomes the set matrix size or less and transmit the control signal CS to the matrix modifier 520. For example, the matrix modification control module 533 may compare the calculated matrix size of the modified parity check matrix with the preset matrix size. The modification control module 533 may control the matrix modifier 520 to stop the cyclic shift when the calculated matrix size of the modified parity check matrix is equal to or smaller than the set matrix size. The matrix modification control module 533 may control the matrix modifier 520 to further perform or iterate cyclic shift on the modified parity check matrix when the calculated matrix size of the modified parity check matrix is larger than the set matrix size.

The controller 530 may control the matrix modifier 520 so that the modified parity check matrix has the same parity characteristic as the parity check matrix and the controller 530 may include a parity characteristic check module 532 and the matrix modification control module 533.

The parity characteristic check module 532 may confirm whether the modified parity check matrix has the same parity characteristic (for example, error detection capacity and error correction capacity) as the parity check matrix. For example, the parity characteristic check module 532 may check whether the parity characteristics of the modified parity check matrix and the parity check matrix are the same as each other by performing the error detection and error correction on data having a preset error bit. Although the parity characteristic of the QC LDPC parity check matrix is not changed even when the row and/or column cyclic shift are performed, the parity characteristic check may be performed to confirm whether the parity check matrix is modified without an error.

When the parity characteristic of the modified parity check matrix is not the same as the parity characteristic of the parity check matrix, the matrix modification control module 533 may control the matrix modifier 520 to modify the parity check matrix from the beginning again. When the parity characteristic of the modified parity check matrix is the same as the parity characteristic of the parity check matrix, the matrix modification control module 533 may control the matrix modifier 520 to stop the cyclic shift when the matrix size of the modified parity check matrix becomes less than or equal to the set matrix size.

The storage 540 may store information representing a finally modified parity check matrix H'. For example, the storage 540 may store information on the indexes and values of the macro components each being the identity matrix within the modified parity check matrix and indexes and values of unit components of the non-zero matrix (i.e., the identity matrix and the circulant permutation matrix) among unit components which are not included in the macro components (assuming that information on the index and value of the unit component as the zero matrix is not stored).

In an embodiment, the storage 540 may be a volatile memory device or a nonvolatile memory device.

The output 550 may output the information representing the modified parity check matrix H' to an external device. For example, the output 550 may output the information representing the parity check matrix, which is modified to have the matrix size equal to or smaller than the preset matrix size, to the external device. Accordingly, the data processing apparatus may store therein the information representing the modified parity check matrix having a small matrix size and provided from the parity check matrix managing apparatus 500 and may perform encoding and decoding on data through the information representing the modified parity check matrix stored therein.

In an embodiment, the output 550 may output the information representing the modified parity check matrix and the information on the matrix size of the modified parity check matrix to a user interface device.

Figure 6:
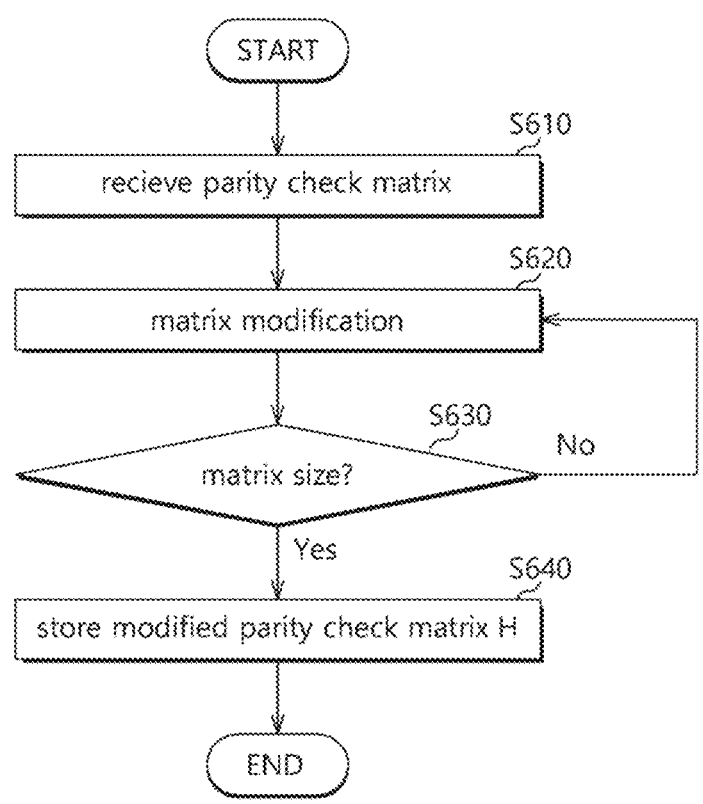
FIG. 6 is a flowchart illustrating a parity check matrix modifying method according to an embodiment of the present disclosure.

FIG. 6 is a flowchart explaining a parity check matrix modifying method according to an embodiment. Such method may be performed by the parity check matrix managing apparatus 500 illustrated in FIG. 5.

Referring to FIG. 6, in operation S610, a parity check matrix may be input. For example, the parity check matrix managing apparatus 500 may receive the parity check matrix to be modified from an external device through the matrix input 510. The parity check matrix managing apparatus 500 may transmit the parity check matrix H to the matrix modifier 520.

In an embodiment, the parity check matrix managing apparatus 500 may receive information on the set matrix size to modify the parity check matrix H to have the desired matrix size, e.g., the set matrix size. Here, the set matrix size may be differently set according to the need of the data processing apparatus using the modified parity check matrix. As described above, a matrix size of a parity check matrix is defined in this disclosure as a size of information indicating indexes and values of unit components and macro components configuring the parity check matrix. The information represents the parity check matrix and is stored in the data processing apparatus.

In an embodiment, the parity check matrix H may correspond a QC LDPC code. Here, the QC LDPC code is a kind of LDPC and each unit component constituting the parity check matrix may form any one of the zero matrix, the identity matrix, and the circulant permutation matrix.

In operation S620, the parity check matrix may be modified. For example, the parity check matrix managing apparatus 500 may modify the parity check matrix by performing cyclic shift on the parity check matrix. The parity check matrix managing apparatus 500 may cyclic-shift an N-th row of the parity check matrix by L (rows) and cyclic-shift an M-th column of the parity check matrix by K (columns).

Here, the values of N, L, M, and K may be determined so that the matrix size is less than or equal to the set matrix size. Further, the parity check matrix managing apparatus 500 may cyclic-shift the unit components in each row or column in the parity check matrix. The parity check matrix managing apparatus 500 may permute, with each other, unit components located in different rows or columns in the parity check matrix.

Further, the parity check matrix managing apparatus 500 may transmit the modified parity check matrix T to the controller 530.

In an embodiment, the parity check matrix managing apparatus 500 may perform cyclic shift on the parity check matrix so that specific unit components (for example, unit components in set unit component group or the macro component) of the parity check matrix may have the identity matrix value. For example, the parity check matrix managing apparatus 500 may cyclic-shift the rows in the parity check matrix so that the unit components in the first column of the parity check matrix form the identity matrix.

In operation S630, an operation of checking a modification result on the modified parity check matrix may be performed.

The parity check matrix managing apparatus 500 may check the matrix size of the modified parity check matrix. For example, the parity check matrix managing apparatus 500 may calculate the matrix size of the modified parity check matrix. The parity check matrix managing apparatus 500 may compare the calculated matrix size of the modified parity check matrix with a set matrix size and may stop the cyclic shift when the calculated matrix size of the modified parity check matrix is equal to or smaller than the set matrix size as indicated by the comparison in operation S630. Then, the parity check matrix managing apparatus 500 may proceed to operation S640. The parity check matrix managing apparatus 500 may store information representing the modified parity check matrix H'. The parity check matrix managing apparatus 500 may proceed to operation S620 when the calculated matrix size of the modified parity check matrix is larger than the set matrix size as the comparison result in operation S630 and then the parity check matrix managing apparatus 500 may further perform cyclic shift on the modified parity check matrix H' again.

In an embodiment, the parity check matrix managing apparatus 500 may calculate the matrix size of the modified parity check matrix T currently modified through cyclic-shift by the matrix modifier 520 based on the indexes and values of the unit components of the modified parity check matrix T. The matrix size calculation module 531 may calculate the matrix size the currently modified parity check matrix T whenever the cyclic shift on the parity check matrix is performed.

The parity check matrix managing apparatus 500 may check the parity characteristic of the modified parity check matrix.

The parity check matrix managing apparatus 500 may confirm whether the modified parity check matrix T has the same parity characteristic (for example, error detection capacity and error correction capacity) as the parity check matrix H. When the parity characteristic of the modified parity check matrix is not the same as the parity characteristic of the parity check matrix, the parity check matrix managing apparatus 500 may perform the cyclic shift on the parity check matrix from the beginning again. Then, the parity check matrix managing apparatus 500 may proceed to operation S620. When the parity characteristic of the modified parity check matrix is the same as the parity characteristic of the parity check matrix, the parity check matrix managing apparatus 500 may stop the cyclic shift when the matrix size of the modified parity check matrix is less than or equal to the set matrix size. Then, the parity check matrix managing apparatus 500 may proceed to operation S640. Although the parity characteristic of the QC LDPC parity check matrix is not changed even when the row and/or column cyclic shift are performed, the parity characteristic check may be performed to confirm whether the parity check matrix is modified without an error.

In an embodiment, the parity check matrix managing apparatus 500 may confirm whether the parity characteristics of the modified parity check matrix T and the parity check matrix H are the same as each other by performing error detection and error correction on data having a preset error bit.

In operation S640, information representing the modified parity check matrix H° may be stored. For example, the parity check matrix managing apparatus 500 may store information representing the modified parity check matrix. In this example, the parity check matrix managing apparatus 500 may store information on the index and value of the macro components each being the identity matrix within the modified parity check matrix and indexes and values of unit components of the non-zero matrix (i.e., the identity matrix and the circulant permutation matrix) among the unit components which are not included in the macro components (assuming that information on the index and value of the unit component as the zero matrix is not stored).

Figure 7:
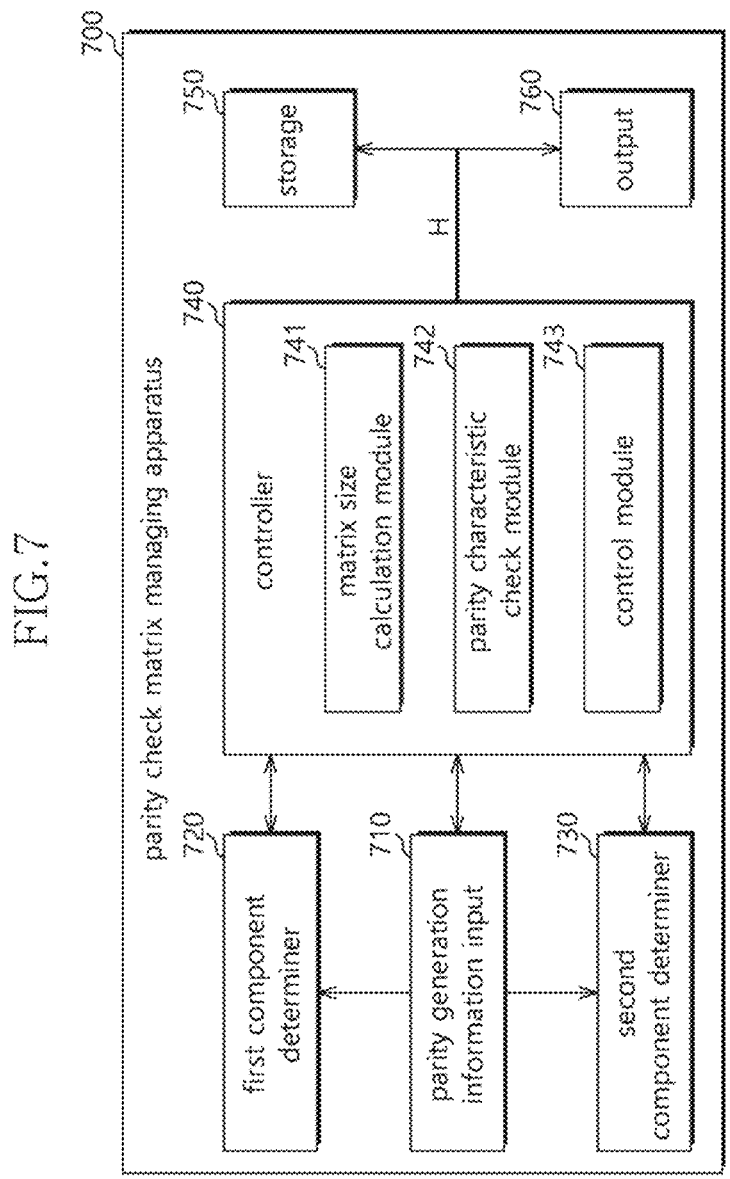
FIG. 7 is a block diagram illustrating a parity check matrix managing apparatus according to an embodiment of the present disclosure.

FIG. 7 is a block diagram explaining a parity check matrix managing apparatus 700 according to another embodiment.

Referring to FIG. 7, the parity check matrix managing apparatus 700 according to another embodiment may include an input 710, a first component determiner 720, a second component determiner 730, a controller 740, a storage 750, and an output 760.

The input 710 may receive matrix generation information to specify a parity check matrix to be generated. The input 710 may transmit the matrix generation information to the first component determiner 720, the second component determiner 730 and the controller 740.

In an embodiment, the parity check matrix to be generated may correspond to a QC-LDPC code. Here, the QC LDPC code may be a kind of LDPC and each unit component constituting the parity check matrix may form any one of the zero matrix, the identity matrix, and the circulant permutation matrix.

In an embodiment, the matrix generation information may include size information (for example, M×N) of the parity check matrix to be generated. The parity check matrix managing apparatus 700 may generate the parity check matrix having a matrix size indicated by the size information included in the matrix generation information. As described above, a matrix size of a parity check matrix is defined in this disclosure as a size of information indicating indexes and values of unit components and macro components configuring the parity check matrix. The information represents the parity check matrix and is stored in the data processing apparatus.

In an embodiment, the matrix generation information may include an index and a value of a set unit component group of the parity check matrix to be generated.

In an embodiment, the matrix generation information may include parity characteristic information of the parity check matrix to be generated. For example, the parity characteristic information may include data coding type, error detection capacity, error correction capacity, and the like for the data processing apparatus to use the generated parity check matrix.

In an embodiment, the matrix generation information may include information on a set matrix size. The parity check matrix managing apparatus 700 may generate a parity check matrix of the set matrix size or less.

The first component determiner 720 may determine values of first unit components which are in the set unit component group of the parity check matrix to be generated. For example, the first component determiner 720 may determine values of unit components corresponding to an index of a set unit component group of the parity check matrix to be generated based on the index and value of the set unit component group in the matrix generation information. In an example, when the index of the set unit component group in the matrix generation information is a first row and a first column and the value of the set unit component group in the matrix generation information is the identity matrix, the first component determiner 720 may determine the values of the unit components in the first row and the second row of the parity check matrix to be generated to be the identity matrix.

The second component determiner 730 may determine values of second unit components which are unit components other than the unit components in the set unit component group of the parity check matrix. For example, when the values of the first unit components in the parity check matrix to be generated are determined, the second component determiner 730 may determine the second unit components among the unit components of the parity check matrix to be generated based on the parity characteristic information included in the matrix generation information. In an example, the second component determiner 730 may primarily determine the values of the second unit components to be at least one value among the zero matrix, the identity matrix, and the circulant permutation matrix. When the primarily determined second unit component value is not the same as the parity characteristic included in the matrix generation information, the second component determiner 730 may determine the second unit component value again. When the primarily determined second unit component value is the same as the parity characteristic included in the matrix generation information, the second component determiner 730 may finally determine the primarily determined second unit component value as the second unit component value under the condition that the calculated matrix size is less than or equal to the set matrix size.

In an embodiment, the second component determiner 730 may determine the second unit component value based on a parity check matrix generation algorithm such as progressive edge-growth (PEG).

In an embodiment, the second component determiner 730 may determine the zero matrix, the identity matrix, and the circulant permutation matrix as the second unit component value.

In an embodiment, the second component determiner 730 may determine the zero matrix, the identity matrix, and the circulant permutation matrix to the second unit component value according to a set criterion, an algorithm, or the like.

The controller 740 may control an overall parity check matrix generation operation. For example, the controller 740 may control the first component determiner 720 and the second component determiner 730 to generate the parity check matrix having the set matrix size included in the matrix generation information. The controller 740 may include a matrix size calculation module 741. The matrix size calculation module 741 may calculate the matrix size based on the first unit component value and the second unit component value. For example, the matrix size calculation module 741 may calculate the matrix size based on the index and value of the set unit component group as the first unit component and the index and value of the second unit component. When the calculated matrix size is equal to or smaller than the set matrix size, the controller 740 may finally generate the parity check matrix based on the determined first unit component value and second unit component value. When the calculated matrix size is larger than the set matrix size, the controller 740 may control the first component determiner 720 and the second component determiner 730 to determine the first unit component value and/or the second unit component value again.

The controller 740 may control the parity check matrix having the parity characteristic included in the matrix generation information to be generated and the controller 740 may include a parity characteristic check module 742. The parity characteristic check module 742 may check whether the determined first unit component value and second unit component value have the parity characteristics included in the matrix generation information. For example, the parity characteristic check module 742 may temporarily generate the parity check matrix based on the determined first unit component value and second unit component value and confirm whether the temporarily generated parity check matrix has the same parity characteristic as the parity characteristic included in the matrix generation information by performing error detection and error correction on data having a set error bit. When the parity characteristic of the temporarily generated parity check matrix is not the same as the parity characteristic included in the matrix generation information, the controller 740 may control the second component determiner 730 to determine the second unit component value again. When the parity characteristic of the temporarily generated parity check matrix is the same as the parity characteristic included in the matrix generation information, the controller 740 may finally generate the parity check matrix based on the determined first unit component value and second unit component value under the condition that the calculated matrix size is less than or equal to the set matrix size.

The controller 740 may include a matrix generation control module 743 configured to generate a control signal required for generating a matrix.

The storage 750 may store information representing the generated parity check matrix. For example, the storage 750 may store information on the index and value of the set unit component group of the generated parity check matrix and indexes and values of unit components of the non-zero matrix (i.e., the identity matrix and the circulant permutation matrix) among unit components which are not included in the set unit component group (assuming that information on the index and value of the unit component as the zero matrix is not stored).

In an embodiment, the storage 750 may be a volatile memory or a nonvolatile memory.

The output 760 may output the information representing the generated parity check matrix H to an external device. Accordingly, the data processing apparatus may perform encoding and decoding on data to be processed by receiving and storing the information representing the parity check matrix generated to have the small matrix size from the parity check matrix managing apparatus 700.

In an embodiment, the output 760 may output the information representing the parity check matrix and the information on the matrix size generated through the controller 740 to a user interface device.

Figure 8:
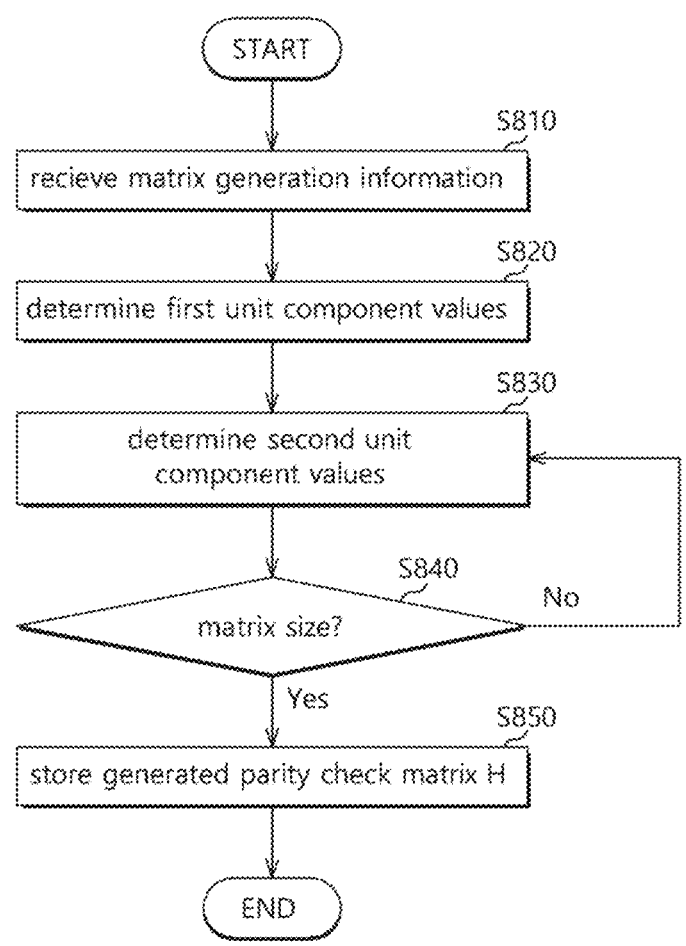
FIG. 8 is a flowchart illustrating a parity check matrix generating method according to an embodiment of the present disclosure.

FIG. 8 is a flowchart explaining a parity check matrix generating method according to another embodiment.

The parity check matrix generating method to be described below illustrated in FIG. 8 relates to an operation example of the parity check matrix managing device 700 illustrated in FIG. 7 and thus it is obvious that the detailed description for FIG. 7 may be applied to the generating method illustrated in FIG. 8.

Referring to FIG. 8, in operation S810, matrix generation information may be input. The parity check matrix managing apparatus 700 may receive the matrix generation information which is information required to specify a parity check matrix to be generated.

In an embodiment, the parity check matrix to be generated may be the parity check matrix corresponding to a QC LDPC code. Here, the QC LDPC code is a kind of LDPC and each unit component constituting the parity check matrix may form any one of the zero matrix, the identity matrix, and the circulant permutation matrix.

In an embodiment, the matrix generation information may include size information (for example, M×N) of the parity check matrix to be generated. The parity check matrix managing apparatus 700 may generate the parity check matrix having a matrix size indicated by the size information included in the matrix generation information. As described above, a matrix size of a parity check matrix is defined in this disclosure as a size of information indicating indexes and values of unit components and macro components configuring the parity check matrix. The information represents the parity check matrix and is stored in the data processing apparatus.

In an embodiment, the matrix generation information may include an index and a value of a set unit component group of the parity check matrix to be generated.

In an embodiment, the matrix generation information may include parity characteristic information of the parity check matrix to be generated. For example, the parity characteristic information may include a data coding type, error detection capacity, error correction capacity, and the like required in the data processing apparatus, which is to use the generated parity check matrix.

In an embodiment, the matrix generation information may include information on a set matrix size. The parity check matrix managing apparatus 700 may generate a parity check matrix of the set matrix size or less.

In operation S820, the first unit component value may be determined. The first unit component value may be values of unit components in the set unit component group of the parity check matrix to be generated. For example, the parity check matrix managing apparatus 700 may determine values of unit components corresponding to the index of the set unit component group of the parity check matrix to be generated based on the index and the value of the set unit component group included in the matrix generation information. In an example, when the index of the set unit component group included in the matrix generation information is a first row and a first column and the value of the set unit component group included in the matrix generation information is the identity matrix, the parity check matrix managing apparatus 700 may determine the values of the unit components included in the first row and the second row of the parity check matrix to be generated to be the identity matrix.

In operation S830, the second unit component value may be determined. The second unit component value may be values of unit components other than the unit components in the set unit component group of the parity check matrix. For example, when the first unit component value in the parity check matrix to be generated is determined, the parity check matrix managing apparatus 700 may determine the second unit components among the unit components of the parity check matrix to be generated based on the parity characteristic information included in the matrix generation information. In an example, the parity check matrix managing apparatus 700 may primarily determine the values of the second unit components to at least one value among the zero matrix, the identity matrix, and the circulant permutation matrix. When the primarily determined second unit component value is not the same as the parity characteristic included in the matrix generation information, the parity check matrix managing apparatus 700 may determine the second unit component value again. When the primarily determined second unit component value is the same as the parity characteristic included in the matrix generation information, the parity check matrix managing apparatus 700 may finally determine the primarily determined second unit component value as the second unit component value under the condition that the calculated matrix size is less than or equal to the set matrix size.

In an embodiment, the parity check matrix managing apparatus 700 may arbitrarily determine the zero matrix, the identity matrix, and the circulant permutation matrix as the second unit component value.

In an embodiment, the parity check matrix managing apparatus 700 may determine the zero matrix, the identity matrix, and the circulant permutation matrix as the second unit component value according to a set criterion, an algorithm, or the like.

In operation S840, a matrix size may be confirmed. For example, the parity check matrix managing apparatus 700 may calculate the matrix size based on the first unit component value and the second unit component value. For example, the parity check matrix managing apparatus 700 may calculate the matrix size based on the index and value of the set unit component group as the first unit component and the index and value of the second unit component. When the calculated matrix size is equal to or smaller than the set matrix size, the parity check matrix managing apparatus 700 may finally generate the parity check matrix based on the determined first unit component value and second unit component value. When the calculated matrix size is larger than the set matrix size, the parity check matrix managing apparatus 700 determine the first unit component value and/or the second unit component value again.

The parity check matrix managing apparatus 700 may control the parity check matrix having the parity characteristic included in the matrix generation information to be generated. The parity check matrix managing apparatus 700 may check whether the determined first unit component value and second unit component value have the parity characteristics included in the matrix generation information. For example, the parity check matrix managing apparatus 700 may temporarily generate the parity check matrix based on the determined first unit component value and second unit component value and confirm whether the temporarily generated parity check matrix has the same parity characteristic as the parity characteristic included in the matrix generation information by performing error detection and error correction on data having a set error bit. When the parity characteristic of the temporarily generated parity check matrix is not the same as the parity characteristic included in the matrix generation information, the parity check matrix managing apparatus 700 may determine the second unit component value again. When the parity characteristic of the temporarily generated parity check matrix is the same as the parity characteristic in the matrix generation information, the parity check matrix managing apparatus 700 may finally generate the parity check matrix based on the determined first unit component value and second unit component value under the condition that the calculated matrix size is less than or equal to the set matrix size.

In operation S850, information representing the generated parity check matrix H may be stored. For example, the parity check matrix managing apparatus 700 may store information on the index and value of the set unit component group of the generated parity check matrix and indexes and values of unit components of the non-zero matrix (i.e., the identity matrix and the circulant permutation matrix) among the unit components which are not included in the set unit component group (assuming that information on the index and value of the unit component as the zero matrix is not stored).

The examples that the parity check matrix managing apparatuses modify the parity check matrix and generate the parity check matrix are separately described with reference to FIGS. 5 to 8 as described above, but the parity check matrix modification operation and the parity check matrix generation operation may be implemented in one parity check matrix managing apparatus.

Figure 9:
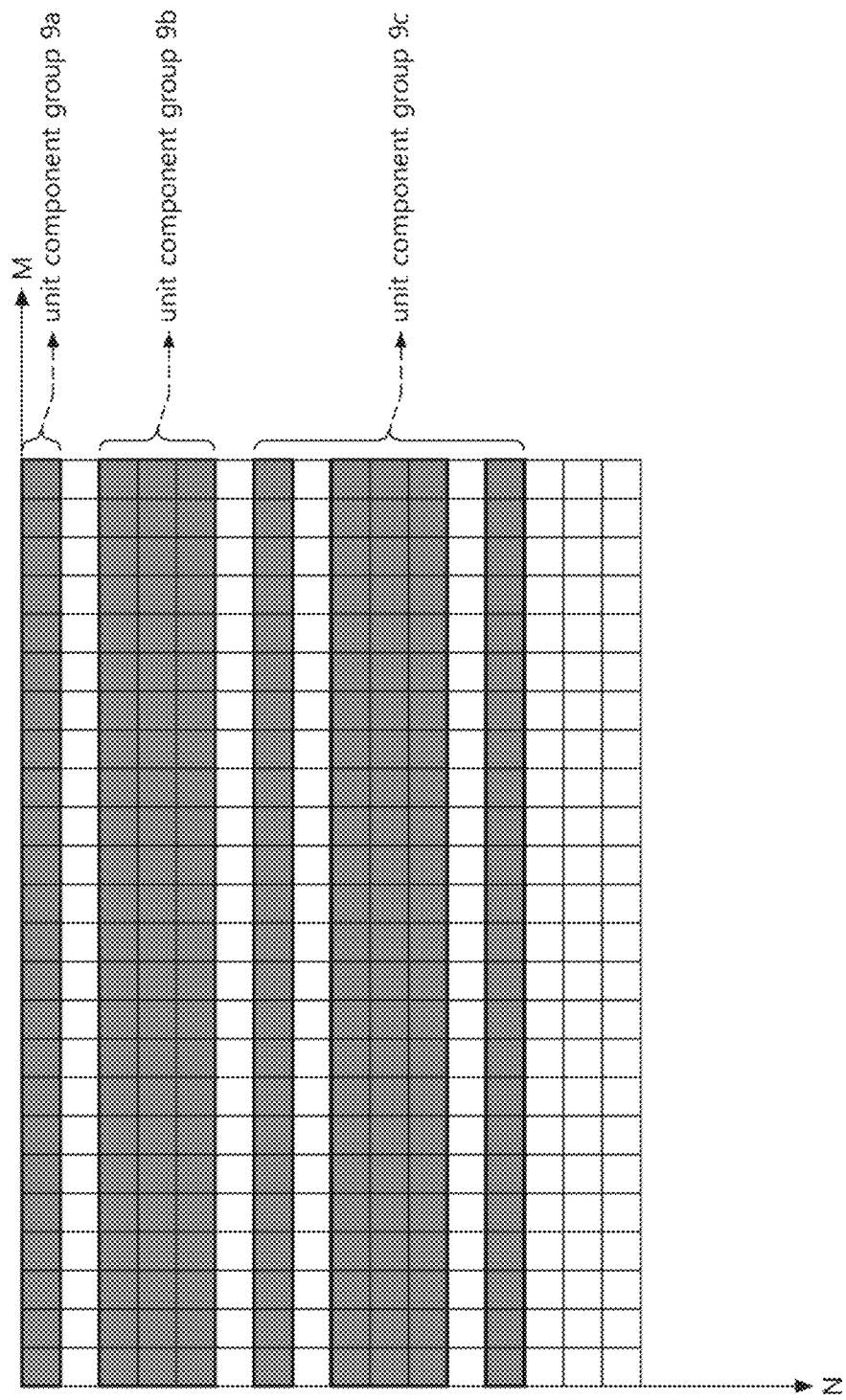
FIGS. 9 and 10 are diagrams illustrating examples of a component group according to an embodiment of the present disclosure.
Figure 10:
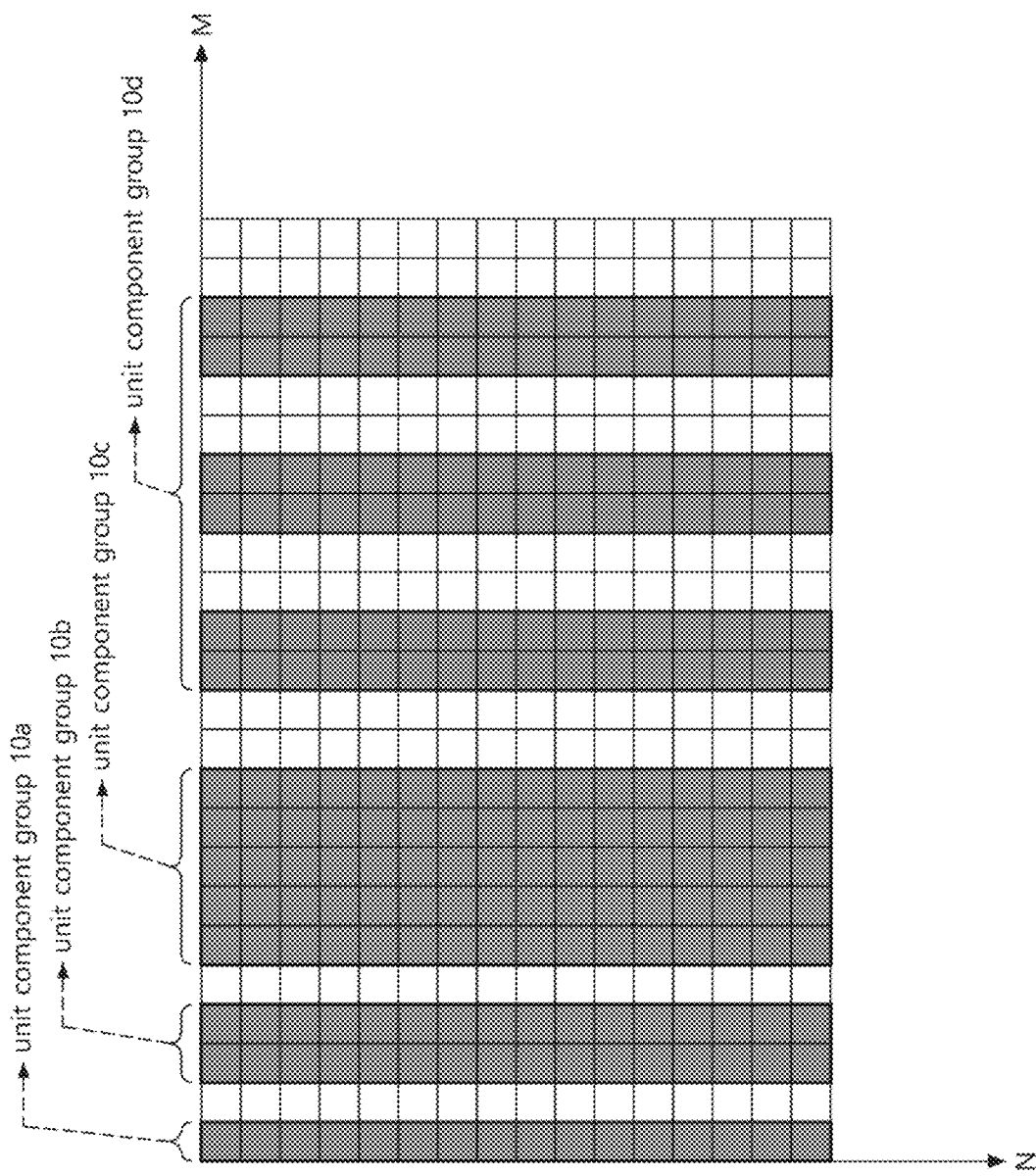

FIGS. 9 and 10 are diagrams explaining examples of a set unit component group according to an embodiment.

Referring to FIG. 9, unit component groups 9a to 9c are illustrated as examples of a unit component group specified by a row. The unit component group 9a may refer to a group of unit components in a first row of the parity check matrix. The unit component group 9b may refer to a group of unit components in third to fifth rows of the parity check matrix. The unit component group 9c may refer to a group of unit components in seventh, ninth to eleventh, and thirteenth rows of the parity check matrix. Here, the unit components in each unit component group may be the zero matrix, the identity matrix, and the circulant permutation matrix. However, when all the unit components in each unit component group have the same value, i.e., all such unit components have the zero matrix value, the identity matrix value, or the circulant permutation matrix value, the matrix size may be minimized. When all the unit components in each unit component group have not the zero matrix value but the identity matrix value, the zero matrix may correspond to any one among the unit components not included in the unit component group and the indexes and values of the unit components having the zero matrix value may not be separately stored. Therefore, the matrix size may be further reduced.

Referring to FIG. 10, unit component groups 10a to 10d are illustrated as examples of a unit component group specified by a column. A unit component group 10a may refer to a group of unit components in a first column of the parity check matrix. The unit component group 10b may refer to a group of unit components in third and fourth columns of the parity check matrix. The unit component group 10c may refer to a group of unit components in sixth to tenth columns of the parity check matrix. The unit component group 10d may refer to a group of unit components in thirteenth, fourteenth, seventeenth, eighteenth, twenty-first, and twenty-second columns.

Figure 11:
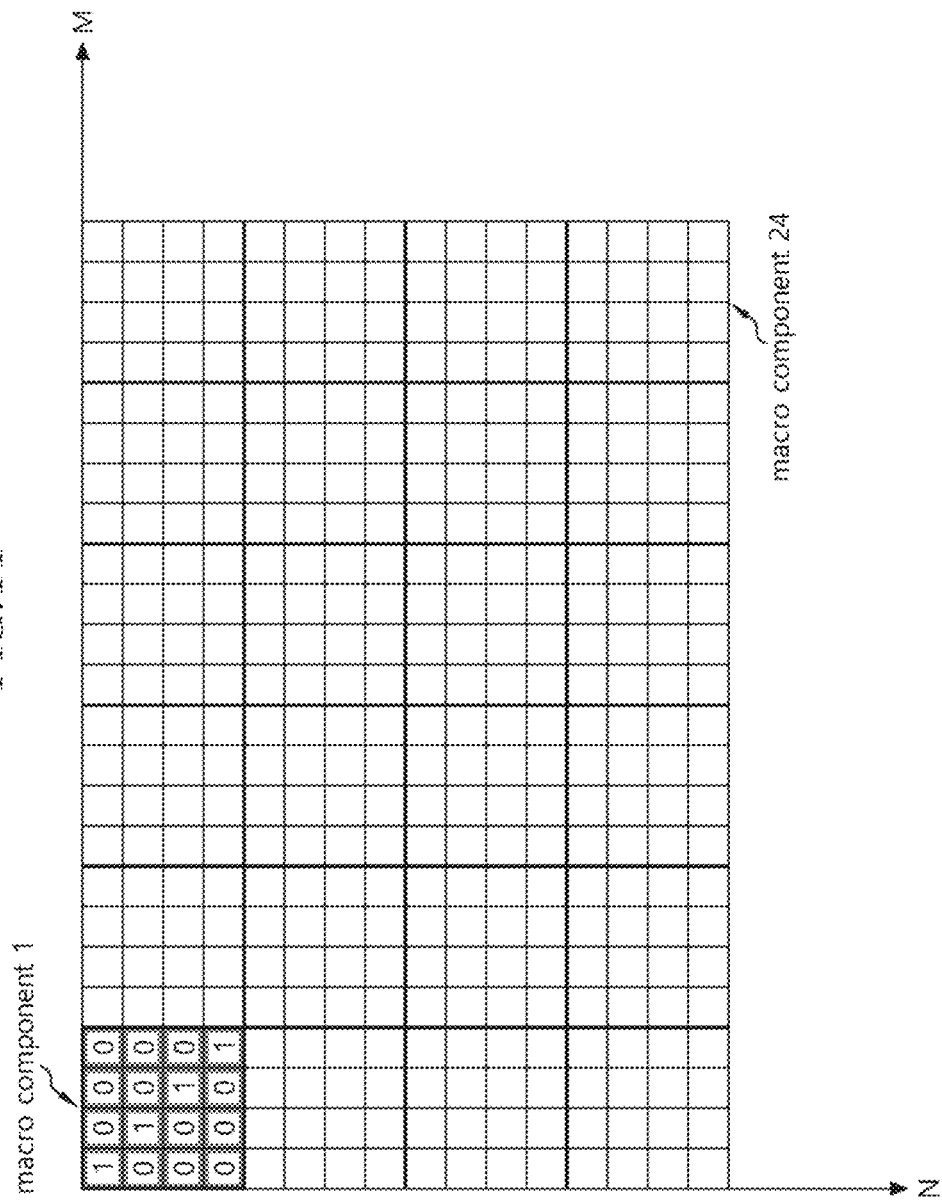
FIGS. 11 to 13 are diagrams illustrating examples of a macro component according to an embodiment of the present disclosure.
Figure 12:
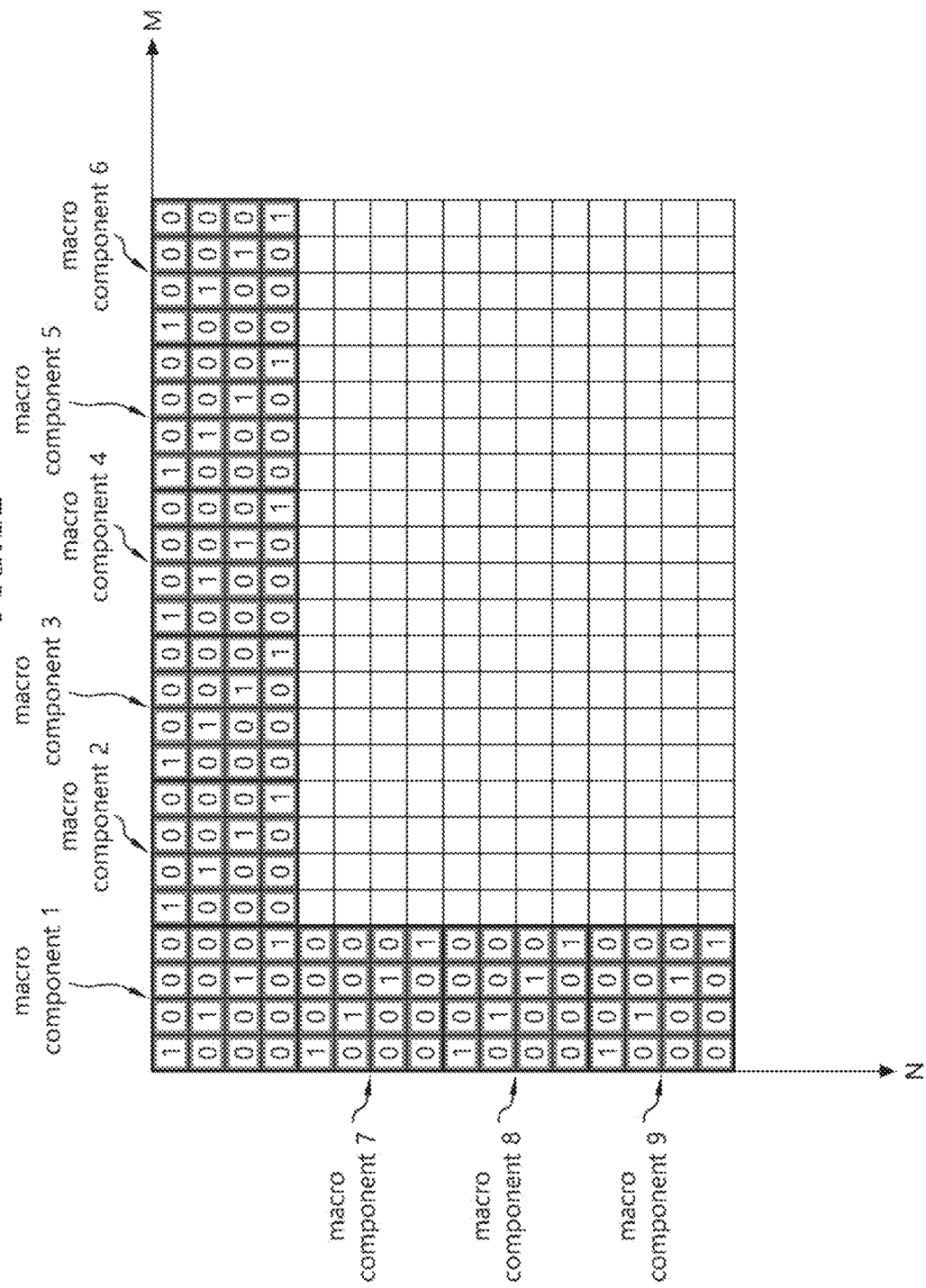
Figure 13:
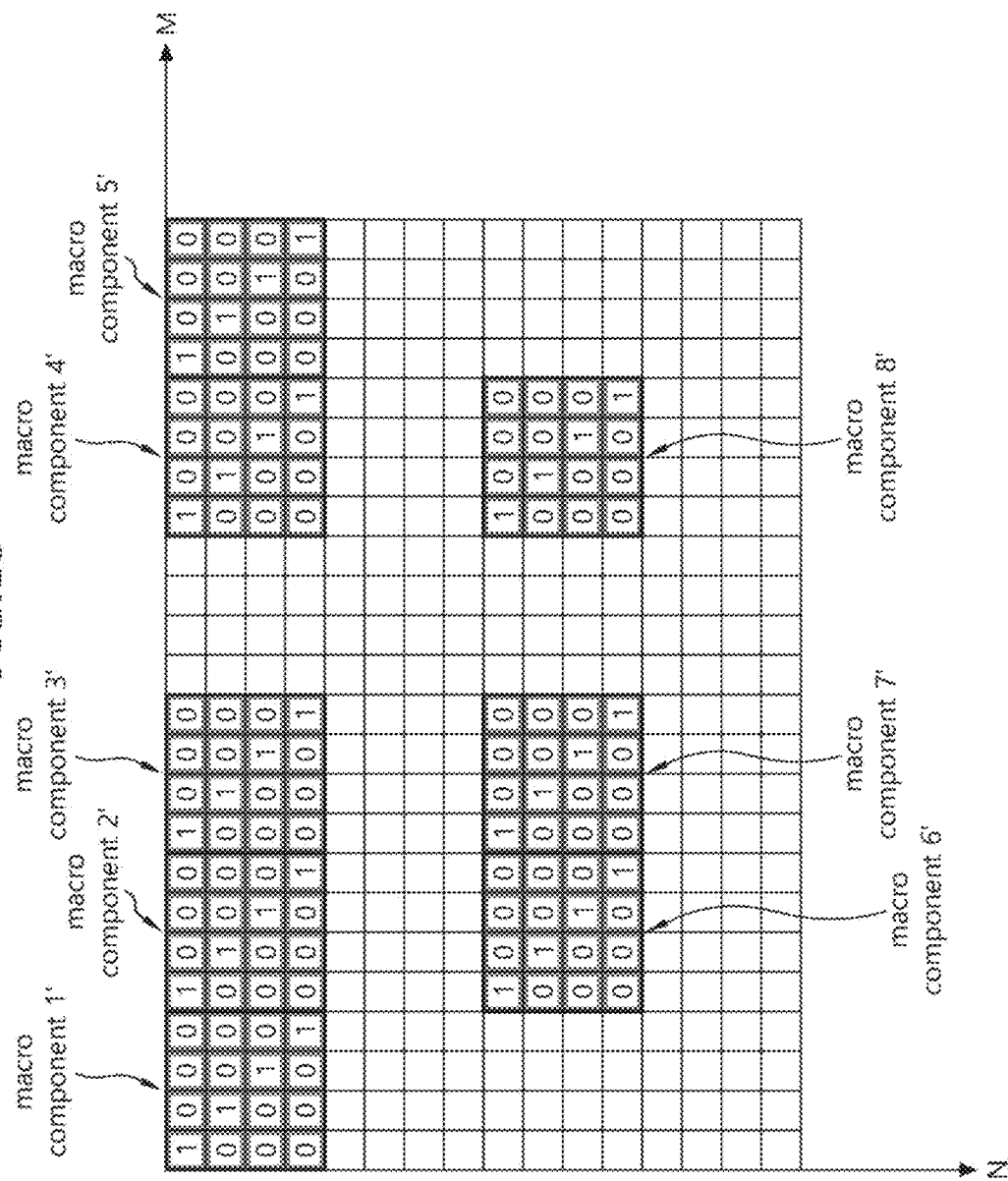

FIGS. 11 to 13 are diagrams illustrating examples of a macro component according to an embodiment.

Referring to FIG. 11, the parity check matrix may be configured of 24 macro components and a first macro component may form the identity matrix. The macro component formed identity matrix illustrated in FIG. 11 is merely an example; alternatively, the first macro component may form the zero matrix or the circulant permutation matrix.

Referring to FIG. 12, unit components i in first to fourth rows and columns may form nine macro components and each of the macro components may form the identity matrix.

Referring to FIG. 13, the parity check matrix may have a 4×4 size in macro component units, that is, may be configured of 8 macro components. Within the parity check matrix, partial macro components (e.g., 8 macro components as exemplified in FIG. 13) among the 24 macro components may be the identity matrixes.

Figure 14:
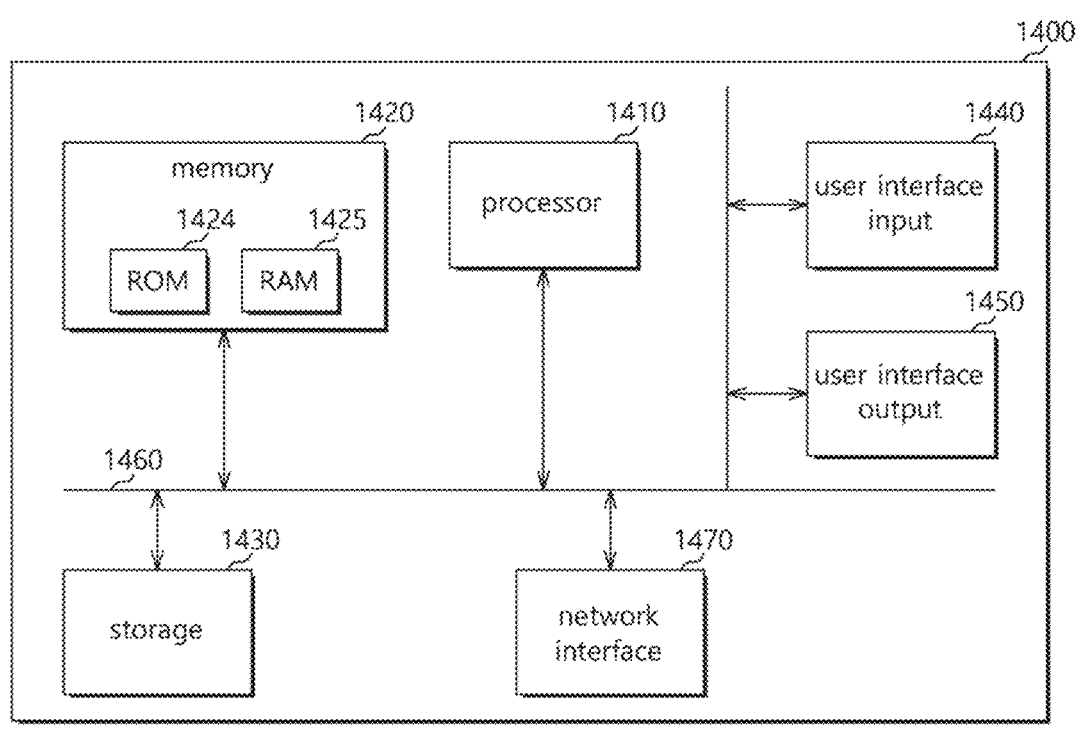
FIG. 14 is a block diagram illustrating a computer system employing a parity check matrix managing apparatus according to an embodiment of the present disclosure.

FIG. 14 is a block diagram illustrating a computer system employing the parity check matrix managing apparatus 700 according to an embodiment.

As illustrated in FIG. 14, a computer system 1400 employing the parity check matrix managing apparatus may include at least one or more processors 1410, a memory 1420, a storage 1430, a user interface input 1440, and a user interface output 1450, and the elements may communicate with each other through a bus 1460. The memory 1420 may store commands for performing the methods illustrated in FIG. 6 and/or FIG. 8 and the processor 1410 may execute the commands stored in the memory. The user interface input 1440 may input any information for the parity check matrix to be modified or generated from the user. The storage 1430 may store the modified or generated parity check matrix. The computer system 1400 may further include a network interface 1470 for access to a network. The network interface 1470 may receive information for the parity check matrix to be modified or generated from an external device and transmit the modified or generated parity check matrix to the external device. The processor 1410 may be a central processing unit (CPU) or a semiconductor device which executes processing commands stored in the memory 1420 and/or the storage unit 1430. The memory 1420 and the storage 1430 may include any of various types of volatile/nonvolatile storage media. For example, the memory 1420 may include a read only memory (ROM) 1424 and a random access memory (RAM) 1425.

The above described embodiments of the present invention are intended to illustrate and not to limit the present invention. Various alternatives and equivalents are possible. The invention is not limited by the embodiments described herein. Nor is the invention limited to any specific type of semiconductor device. The present invention encompasses all additions, subtractions, and modifications that fall within the scope of the appended claims.

What is claimed is:

1. A parity check matrix managing apparatus comprising:
an input device to a volatile or non-volatile memory device, the input configured to receive a parity check matrix as a modification target; and
a data processor of the memory device comprising a matrix modifier and a controller, wherein
the matrix modifier is configured to modify the parity check matrix by performing at least one of a cyclic shift on unit components of at least one row or column in the parity check matrix and a location change between at least two or more rows or columns in the parity check matrix to generate a modified parity check matrix; and
the controller is configured to control the matrix modifier to compare a matrix size of the modified parity check matrix with a set matrix size to determine if the matrix size is less than equal to the set matrix size; and wherein the controller includes:
a parity characteristic check module configured to check whether the modified parity check matrix has the same error detection capacity as the parity check matrix; and
a matrix modification control module configured to control the matrix modifier to further modify the modified parity check matrix when the error detection capacity of the modified parity check matrix is not the same as that of the parity check matrix.

2. The parity check matrix managing apparatus of claim 1, wherein the parity check matrix corresponds to a quasi-cyclic low-density parity check (QC LDPC) code.

3. The parity check matrix managing apparatus of claim 2, wherein the controller controls the matrix modifier so that a set unit component group among unit components of the modified parity check matrix, is set as an identity matrix.

4. The parity check matrix managing apparatus of claim 3, wherein the set unit component group is at least one row or column in the modified parity check matrix.

5. The parity check matrix managing apparatus of claim 3, wherein the set unit component group is at least one among a plurality of macro components constituting the modified parity check matrix.

6. The parity check matrix managing apparatus of claim 5, wherein the macro component as the set unit component group forms one identity matrix and each unit component of the macro component has a zero matrix value or an identity matrix value.

7. The parity check matrix managing apparatus of claim 1, wherein the matrix modifier includes:
a row modification module configured to perform a row modification by cyclic-shifting unit components of an N-th row of the parity check matrix by L (rows) or change a position between the N-th row and another row of the parity check matrix; and
a column modification module configured to perform a column modification by cyclic-shifting unit components of an M-th column of the parity check matrix by K (columns) or change a position between the M-th column and another column of the parity check matrix,
wherein the controller sets values of N, L, M, and K associated with the row modification and the column modification so that the matrix size is less than or equal to the set matrix size.

8. The parity check matrix managing apparatus of claim 1, wherein the controller includes:
a matrix size calculation module configured to calculate the matrix size of the modified parity check matrix; and
a matrix modification control module configured to compare the calculated matrix size with the set matrix size and control the matrix modifier to further modify the modified parity check matrix when the calculated matrix size is greater than the set matrix size.

9. The parity check matrix managing apparatus of claim 8, further comprising:
a first component determiner configured to determine first-unit-component values of first unit components, which are unit components corresponding to a set unit component group among unit components of the parity check matrix, based on an index and a value of the set unit component group; and
a second component determiner configured to determine second-unit-component values of second unit components, which are unit components not included in the set unit component group among unit components of the parity check matrix, based on parity characteristic information provided to the second component determiner in matrix generation information,
wherein the input unit further receives the matrix generation information for a parity check matrix to be generated, which includes the index and the value of the set unit component group of the parity check matrix to be generated and the parity characteristic information of the parity check matrix to be generated,
wherein the matrix size calculation module further calculates the matrix size for the parity check matrix to be generated, based on the first-unit-component values and the second-unit-component values of the first and second unit components, and
wherein the matrix generation control module controls the second component determiner to determine the second-unit-component values of the second unit components again when the calculated matrix size is greater than the set matrix size.

10. A parity check matrix managing apparatus comprising:
an input to a volatile or non-volatile memory device, the input configured to receive matrix generation information for a parity check matrix and parity characteristic information, the matrix generation information including an index and a value of a set unit component group in the parity check matrix; and
a data processor of the memory device comprising a first component determiner, a second component determiner, and a controller,
wherein
the first component determiner is configured to determine first-unit-component values of first unit components, which are unit components corresponding to the set unit component group among unit components of the parity check matrix, based on the index and value of the set unit component group;
the second component determiner is configured to determine second-unit-component values of second unit components, which are unit components not included in the set unit component group, based on the parity characteristic information provided to the second component determiner in the matrix generation information;
the controller is configured to control the first component determiner and the second component determiner to produce a subsequently-generated parity check matrix based on the first-unit-component and the second-unit-component values, and
the controller includes:
a parity characteristic check module configured to check whether a parity characteristic of the subsequently-generated parity check matrix is the same as that of the parity check matrix; and
a matrix generation control module configured to control the second component determiner to re-determine the second-unit-component values of the second unit components when the parity characteristics are not the same as each other.

11. The parity check matrix managing apparatus of claim 10, wherein the parity check matrix corresponds to a quasi-cyclic low-density parity check (QC LDPC) code.

12. The parity check matrix managing apparatus of claim 11, wherein the set unit component group is at least one column or row in the parity check matrix.

13. The parity check matrix managing apparatus of claim 12, wherein the first-unit-component values of the first unit components are an identity matrix.

14. The parity check matrix managing apparatus of claim 11, wherein the set unit component group is at least one among a plurality of macro components constituting the parity check matrix.

15. The parity check matrix managing apparatus of claim 14, wherein the macro component as the set unit component group forms one identity matrix and each of unit components in the macro component has a zero matrix value or an identity matrix value.

16. The parity check matrix managing apparatus of claim 11, wherein the second component determiner sets the second-unit-component values of the second unit components to any one value among a zero matrix, an identity matrix, and a circulant permutation matrix so that the parity characteristic of the subsequently-generated parity check matrix is the same as that of the parity check matrix.

17. The parity check matrix managing apparatus of claim 10,
wherein the matrix generation information further includes information of a set matrix size, and
wherein the controller includes:
a matrix size calculation module configured to calculate a matrix size of the parity check matrix based on the first-unit-component and the second-unit-component values of the first and second unit components; and
a matrix generation control module configured to control the second component determiner to re-determine the second-unit-component values of the second unit components when the calculated matrix size is greater than the set matrix size.

18. A parity check matrix modifying method comprising:
receiving in a data processor of a volatile or non-volatile memory device a parity check matrix as a modification target; and
wherein the data processor of the memory device performs:
modifying the parity check matrix by performing at least one of cyclic shift on unit components of at least one row or column in the parity check matrix and location change between at least two or more rows or columns in the parity check matrix;
controlling the cyclic shift by comparing a matrix size of the modified parity check matrix with a set matrix size to determine if the matrix size is less than or equal to the set matrix size;
checking whether the modified parity check matrix has the same error detection capacity as the parity check matrix; and
controlling to further modify the modified parity check matrix when the error detection capacity of the modified parity check matrix is not the same as that of the parity check matrix.

* * * * *